United States Patent
Hilgarth et al.

(12)

(10) Patent No.: US 10,074,761 B2
(45) Date of Patent: Sep. 11, 2018

(54) SOLAR CELL ASSEMBLY AND METHOD FOR CONNECTING A STRING OF SOLAR CELLS

(75) Inventors: Just Hilgarth, Ilsfeld (DE); Dieter Poeck, Hamburg (DE); Paul Uebele, Untergruppenbach (DE)

(73) Assignee: Azur Space Solar Power GmbH, Heilbronn (DE)

( * ) Notice: Subject to any disclaimer, the term of this patent is extended or adjusted under 35 U.S.C. 154(b) by 788 days.

(21) Appl. No.: 11/574,840

(22) PCT Filed: Sep. 7, 2005

(86) PCT No.: PCT/EP2005/009600
§ 371 (c)(1),
(2), (4) Date: May 3, 2007

(87) PCT Pub. No.: WO2006/027225
PCT Pub. Date: Mar. 16, 2006

(65) Prior Publication Data
US 2008/0000523 A1 Jan. 3, 2008

(30) Foreign Application Priority Data
Sep. 11, 2004 (DE) .................. 10 2004 044 061

(51) Int. Cl.
*H01L 31/00* (2006.01)
*H01L 31/05* (2014.01)
(Continued)

(52) U.S. Cl.
CPC ...... *H01L 31/0508* (2013.01); *H01L 31/0443* (2014.12); *H01L 31/0475* (2014.12); *H01L 31/0504* (2013.01); *Y02E 10/50* (2013.01)

(58) Field of Classification Search
CPC ............. H01L 27/1421; H01L 31/0687; H01L 31/044; H01L 31/0443; H01L 31/0475;
(Continued)

(56) References Cited

U.S. PATENT DOCUMENTS 3,912,539 A * 10/1975 Magee ........................ 136/244
4,481,378 A 11/1984 Lesk
(Continued)

FOREIGN PATENT DOCUMENTS

DE           196 26 082 A1    1/1998
DE    10 2008 007 682 B4      5/2014
(Continued)

OTHER PUBLICATIONS

Taylor et al, Shadow Protection for Tandem Solar Cells in Space, Solar Energy Materials and Solar Cells El Sevier Science Publishers, Amsterdam NL vol. 66, No. 1-4, Feb. 2001, pp. 567-571.
(Continued)

*Primary Examiner* — Thanh Truc Trinh
(74) *Attorney, Agent, or Firm* — Muncy, Geissler, Olds & Lowe, P.C.

(57) ABSTRACT

The invention relates to a solar cell assembly comprising at least one first solar cell and at least one discrete protective diode (101) that is connected to the solar cell. The aim of the invention is to comprehensively protect a solar cell, a solar cell composite or a string of cells by means of one or more protective diodes, without resorting to the use of the material of the solar cells. To achieve this, in addition to a front and a rear contact (13, 15), the protective diode comprises an additional contact (14) that is placed at a distance from the front contact and is electrically connected to said contact via a p/n junction. A connector leads from the additional contact to a second solar cell, the latter in turn being connected to the first solar cell in a string.

26 Claims, 6 Drawing Sheets

(51) Int. Cl.
*H01L 31/0475* (2014.01)
*H01L 31/0443* (2014.01)

(58) Field of Classification Search
CPC .. H01L 31/0508; H01L 31/0504; Y02E 10/50
USPC ................................. 136/244, 256
See application file for complete search history.

(56) References Cited

U.S. PATENT DOCUMENTS

| | | | | |
|---|---|---|---|---|
| 5,616,185 | A * | 4/1997 | Kukulka | ............ 136/244 |
| 6,034,322 | A | 3/2000 | Pollard | |
| 6,147,296 | A * | 11/2000 | Freundlich | ............ 136/255 |
| 6,271,462 | B1 * | 8/2001 | Tsuzuki | ......... H01L 31/18 |
| | | | | 136/243 |
| 6,353,176 | B1 | 3/2002 | Taylor et al. | |
| 6,563,289 | B1 * | 5/2003 | Cross | ............ 320/101 |
| 6,610,919 | B2 * | 8/2003 | Ohkubo | ...... H01L 31/0508 |
| | | | | 136/244 |
| 8,767,983 | B2 | 7/2014 | Theuss et al. | |
| 8,969,981 | B2 | 3/2015 | Kanai et al. | |
| 2003/0029494 | A1 | 2/2003 | Ohkubo | |
| 2004/0040593 | A1 | 3/2004 | Ho et al. | |
| 2004/0089339 | A1 * | 5/2004 | Kukulka et al. | ............ 136/251 |
| 2005/0183660 | A1 | 8/2005 | Furukawa et al. | |
| 2009/0014822 | A1 | 1/2009 | Poo et al. | |

FOREIGN PATENT DOCUMENTS

| | | |
|---|---|---|
| EP | 0984496 | 3/2000 |
| EP | 2 688 094 A1 | 1/2014 |
| JP | 64-024864 | 2/1989 |
| JP | 64-24864 | 2/1989 |
| JP | 1-76059 | 5/1989 |
| JP | 2006-294983 A | 10/2006 |
| WO | 03012880 | 2/2003 |

OTHER PUBLICATIONS

Japanese Final Office Action dated Aug. 20, 2013 corresponding to Japanese Patent Application No. 2007-530643; with English language translation.

* cited by examiner

☐ n-DOPING
▨ p-DOPING
▥ n-p TUNNEL DOPING
⤋ ▭ FLOW DIAGRAM WITH DIODE AND RESISTANCE

SOLAR CELL ASSEMBLY AND METHOD FOR CONNECTING A STRING OF SOLAR CELLS

The invention concerns a solar cell assembly comprising at least one first solar cell with photoactive semiconducting layers running between front and rear contacts, as well as at least one discrete protective diode that is connected to the solar cell, with a substrate made of semiconducting material and having a first conductivity, a layer formed in or affixed on a surface area of the substrate having a second conductivity, a first metallic contact arranged on the layer having the second conductivity, and a second metallic contact arranged on the substrate, wherein connectors for interconnecting the protective diodes go out from the first and the second metallic contacts. The invention also concerns a process for interconnecting a string of solar cells.

Due to the fundamentally higher efficiency of the conversion of sunlight into current especially in space travel cells of inexpensive silicon, the emphasis of semiconductor and solar cell assembly tends toward the use of III-V semiconducting solar cells (III=elements of the $3^{rd}$ group of the periodic system, such as Ga or In; V=elements of the $5^{th}$ group of the periodic system, such as As or P), which are considerably more expensive with regard to material and production.

In the corresponding solar cells, the production of the photoactive layers is carried out in an expensive crystalline growing process (epitaxy) by generally cutting a multitude of different monocrystalline layers from a monocrystalline germanium wafer (Ge substrate wafer), which is generally very expensive in comparison with silicon. These epitaxy wafers contain all the elements required for the conversion of sunlight after the layer deposition. After their production, they are then further processed to solar cells with the usual photolithographic processes that are customary in semiconductor technology along with etching, metallization, and antireflection evaporation, etc., and are finally cut out from the wafer.

Layer sequences, which have a different sensitivity to the different wavelengths of light, can be deposited one over the other by means of a suitable selection of the layers and their composition of different III-V materials, and these can be processed to so-called "multi-junction" solar cells, which contributes to explaining the high efficiency of the cells. The current state of the art consists of triple cells, that is, three mutually superimposed subcells, wherein two are epitaxially grown from III-V material and the third is made of active mixed Ge substrate. The III-V solar cells are usually made from round wafers (substrates) with a diameter of 100 mm (4" wafers).

A triple cell is a threefold cell with three superimposed serially connected solar cells (3 cells (subcells) with different spectral sensitivity for the increase of the total efficiency of the triple cell; "multi-junction" cell: cells with several subcells)).

The corresponding multi-junction solar cells in the form of triple cells can be comprised, for example, of a Ge bottom cell configured on the Ge substrate, a GaInAs central cell, and a GaInP top cell.

The price of the epitaxy wafer for producing silicon solar cells is currently more than 20 times the price of a silicon wafer of the same size. Because of the high price of the starting material in the form of the epitaxy wafer for producing III-V solar cells, the number of process steps should be kept as low as possible in order to reduce failure due to the solar cell production process, in order to prevent a further cost increase of the final price of the cell.

Due to the greater specific weight of the III-V compounds and the germanium in comparison with silicon (approx. factor 4) and the high cost of transporting satellites into space, the III-V wafers are usually thinner than is customary in standard semiconductor technology (for example, IC production), whereby the failure risk is increased even more due to the increased manufacturing effort, especially since the Ge substrates are also considerably more brittle than Si wafers.

Relatively large cells are sought in order to keep the complexity of the connection of the cells to strings (unit per series interconnected solar cells to the operating voltage desired on a panel; surface (wing) equipped with solar cells, as is common in satellites) as low as possible, but also to prevent obtaining excessively short strings, since the operating voltage of the modern III-V cells amounts to a multiple of the Si cells. At the same time, the high price of the epitaxy wafers makes it desirable to utilize the greatest possible surface of the wafer for the cells. Due to reasons of cost, cells with approx. 8 cm×4 cm and two cropped corners (so-called cropped corner cells), wherein two cells are obtained from a 4" wafer, have become common. A larger portion of the wafer surface can be utilized for the cell by cropping the corners than with purely rectangular cells.

With a qualitatively insufficient wafer edge with a 2 mm width of a wafer with a diameter of 100 mm, a surface of 72.4 cm$^2$ is obtained. Two rectangular cells can achieve a maximum surface of 6.79 cm×6.79 cm=46.1 cm$^2$ (64%), while with two cells having a 8 cm×4 cm edge length with cropped corners of, for example, 1.35 cm, a surface of 60.34 cm$^2$ can be obtained, so that 83% of the wafer surface can be utilized. Due to their geometry, these cells do not completely fill the surface of a panel: a triangular surface that is not utilized for light conversion remains at the edges between the cells.

In semiconducting diodes having a large surface, such as those formed by the solar cells, the occurrence of local small-dimensioned high-ohmic electric connections by way of the p-n junction of the semiconducting material (micro short circuits), such as, for example, due to surface damage that occurs during production or especially with epitaxed p-n junctions as in III-V solar cells due to doping material accumulations (degenerated semiconducting material), for example, crystal disruptions (for example, damage due to a slightly deviating crystal grid), is frequently unavoidable. It is known that these micro short circuits, which do not or only very slightly reduce the function of the diodes as solar cells (p-n junction in flow direction), can lead to the destruction of the cells in the string during the operation of the cell in the locking direction. With the locking p-n junction, the solar current can be forced through the high ohmic micro short circuits by the high string voltage $U_s$ with the capacity $N=U_s \square I_s$. This can lead to excessive localized heat, redoping to low impedance (strong denaturing of the semiconductor), and ultimately to the destruction of the cells.

A protection against this destruction is obtained by means of a so-called bypass or protective diode, that is, a diode that is antiparallel connected to the p-n junction of the shaded cell, which is poled in the flow direction when the p-n junction of the cell is locked and allows the current with a voltage Ud to pass, which corresponds to the characteristic of this diode in the flow direction particularly with this current. The voltage Ur at the ends of the string is reduced by means of the missing voltage Um of the cell and the flow voltage of the diode Ud: Ur=Us−Um−Ud. In the unshaded status of the cell, the p-n junction of the protective diode blocks the current flow through it with a block voltage, which corresponds merely to the flow voltage of the corresponding solar cell.

The utilization of protective diodes for the cells in order to prevent the destruction of individual cells in the string with shading in the form of diodes that are electrically antiparallel connected to the cells is known per se.

Monolithically integrated protective diodes (monolithic diodes), that is, diodes that are produced from similar elements as the cells already during the production of the epitaxy directly on the wafer in most additional process steps, are provided as a solution for the III-V cells and are processed to such in additional technology steps during the production of the cells, and are then located on the cells (refer to, for example, DE-A-3,826,721, United States Patent Application 2002/0179141).

A fundamental disadvantage of these solutions consists in that the active surface of the cells is reduced. The protective diodes are selected therefore in general as small as possible in their dimensions. In this way, their voltage during current flow and therefore their capacity is increased. This can lead to their destruction in the long run or (because the protective diode is a part of the cell) to an undesirably high heating thereof.

Since the monolithic diodes require an additional expenditure on the wafer plane, that is, they require additional epitaxy layers and additional technological processes during the cell production, they constitute an additional cost factor that is not negligible. Since the monolithic diodes can only be made of III-V material that is adapted to the grid, also only a limited freedom is possible for the selection of the type of diode (only III-V diodes with high flow voltage).

A discrete diode, which can be produced independently from the production of the cell, and thus also offers more material freedom, would therefore be preferable. It would have the additional advantage that it could be selected and tested independently from the cell, so that a diode that had already been damaged during production would not also imply at the same time an expensive unusable cell.

The mounting of discrete diodes on solar cells as an alternative to the monolithic integrated protective diodes generally requires from the manufacturers of solar wings (panels) an additional expenditure for their mounting. This applies in particular to rectangular solar cells, which completely fill the surface of the panel, so that a switch to the third dimension (supply lines and diodes underneath the cells) must be undertaken in order to mount the protective diodes. This implies a high expenditure for the panel production. In addition, the weight of the panel would be increased due to the additional necessary long supply cable.

U.S. Pat. No. 4,481,378 discloses a solar cell module with solar cells and protective diodes connected in series, in which respectively one protective diode is antiparallel connected to one cell. The protective diodes are connected to the rear sides of adjacent cells and are arranged in the intermediate spaces between the solar cells.

According to U.S. Pat. No. 6,563,289, a corner of an originally rectangular solar cell is separated and connected to the solar cell as protective diode with opposite poling.

A solar cell assembly according to U.S. Pat. No. 6,353,176 comprises solar cells with cropped corners, in which protective diodes can be arranged.

A solar cell assembly with current-limiting protection according to U.S. Pat. No. 6,034,322 comprises rectangular solar cells with a cropped edge at one corner, in which a triangular diode for the protection of the solar cell can be arranged. As connectors, those that allow movement within the plane of the solar cells are used.

According to United States Patent Application 2003/0,029,494, protective diodes are integrated within a solar cell string, wherein a connector leads from the front side of the protective diode to the rear side of an adjacent solar cell, which is connected in series in the string to the front side of the solar cell to be protected. The rear side contact of the protective diode leads to the rear side of the cell to be protected.

It is an object of the invention to further develop a solar cell assembly of the aforementioned kind in such a way that a solar cell or a solar cell combination, such as a string, can be sufficiently protected by means of one or more protective diodes, without necessarily having to resort to the materials of the solar cells themselves. A problem-free interconnection between the protective diodes and the solar cells should also be possible, while a high weight increase should be prevented at the same time.

The object is attained according to the invention essentially in that the second contact is in direct contact with the substrate of the protective diode and is arranged beside the first metallic contact and at a distance therefrom, and is electrically connected to the first metallic contact by way of a p-n junction. Therein, the first or the second metallic contact can be connected to the rear side of the second solar cell and the third metallic contact can be connected to the front side of the first solar cell. In addition, the protective diode is antiparallel connected by way of the first or second metallic contact to the first solar cell by way of the second solar cell.

A solar cell assembly is especially proposed, which comprises a discrete protective diode, which is structured in such a way with regard to the area on the front side that, aside from the n-p or p-n junction of the protective diode, a direct ohmic contact between the second metallic contact and the substrate of the protective diode is produced in order to enable, on the one hand, an electrically conducting connection between the solar cells and, on the other hand, an antiparallel connection of the protective diode to the solar cell to be protected.

The object of the protection of a solar cell in a string is attained according to the invention essentially by means of an antiparallel connected discrete diode, consisting of a semiconductor element having a first conduction type (substrate), in which a second metallic contact, which is electrically connected directly to the substrate, is provided on the front side beside the first metallic contact on a semiconductor area having a second conduction type, which is mounted at a distance on the semiconductor of the first conduction type and electrically separated by means of a p-n junction. In this way, depending on the type of solar cell and selection of the conduction type of the substrate of the diode, the rear side of the solar cell to be protected is electrically connected by means of connectors to the diode by way of the first or the second contact, and with the second respectively first metallic contact of the diode to the rear side of the cell following in the string directly after the cell to be protected, which in turn is electrically connected in a string to the front side of the preceding cell to be protected by means of connectors for the series interconnection of the solar cells to a string, whereby the diode forms a protective diode that is antiparallel connected to the solar cells to be protected in the combination.

In a further embodiment, it is provided that the first and second solar cells are connected by way of at least two protective diodes, and a third metallic contact of the one first protective diode is connected both to the rear contact of the second solar cell and to the second metallic contact of the second protective diode, whose third metallic contact is connected to the front contact of the first solar cell. A simple interconnection of the solar cells between each other with a simultaneous interconnection of the protective diodes to the solar cells to be protected is consequently obtained.

In the connection of the two solar cells by way of two protective diodes, one of the protective diodes can be configured in such a way that the second metallic contact is connected to the first metallic contact, and the surface area having the second conductivity extends underneath the first and the second metallic contact.

In order to make possible a simple connection of the connectors, which go out from the first and second protective diode and connect them to one another, it is provided according to a further proposal of the invention that a connector, which goes out of the second metallic contact of the first protective diode, projects with a connector, which goes out of the second metallic contact of the second protective diode, beyond the front side of the first and second solar cells or their cover glass, and that these are preferably connected outside of the cover glass by welding or soldering.

Regardless of whether the solar cells are connected by way of one or more protective diodes, an inventive proposal of the invention provides that the first solar cell and/or the second solar cell have a rectangular shape with cropped corners in plan view and that at least one protective diode runs within the area of one of the cropped corners. In this way an optimal utilization of the panel surface is obtained, while a simple interconnection of the protective diodes and solar cells is made possible at the same time.

It is provided in particular that several solar cells, which are connected in a string, are connected by way of corresponding protective diodes. In this way, a protective diode can be arranged in each cropped corner. Protective diodes and solar cells are therein within one plane.

According to the invention, it is proposed to provide the protective diode with a triangular geometry in plan view.

The protective diode is particularly provided with the geometry of a triangular column.

In a solar cell having a square surface with cropped corners and an edge length of 8 cm, the protective diode should have a base surface F of preferably about $0.7$ $cm^2 \leq F \leq 1$ $cm^2$, especially about $0.8$ $cm^2 \leq F \leq 0.9$ $cm^2$, before the corners are removed.

The invention also concerns a process for interconnecting a solar cell string, which is characterized by the process steps of:
Arranging the solar cells with the rear side on a substrate,
Connecting the front contacts of the solar cells to the first connectors,
Mounting one or more transparent covers on the front sides of the solar cells,
Rotating the solar cells,
Connecting the first and second solar cells in a string by way of the first connector,
Introducing the protective diodes into the free spaces existing between the solar cells,
Connecting the protective diodes to the solar cells, and
Connecting the strings obtained in this way to a substrate.

The adjacent solar cells are interconnected in series by way of the first connector especially before introducing the protective diodes.

In a further embodiment, it is provided to arrange the protective diodes with their rear side contacts, that is, third metallic contacts, in the front area of the solar cells, and to interconnect the adjacent solar cells in series by way of at least one protective diode, with a simultaneous antiparallel interconnection of the protective diodes to one of the adjacent solar cells.

Especially provided are the process steps of:
a) Arranging the solar cells with the rear side on the substrate,
b) Introducing the protective diode into the spaces existing between the solar cells,
c) Connecting the front contacts of the solar cells to the two contacts that run on the front side (rear side contacts) of the protective diodes within the string,
d) Mounting one or more transparent covers on the front sides of the solar cells,
e) Rotating the solar cells,
f) Connecting the first and third contacts (front contacts) of the protective diodes running on the rear side within the string to rear contacts of adjacent solar cells, and
g) Connecting the strings produced in this way to a substrate.

Therein, the string can be rotated before it is connected to the substrate.

The invention further provides to arrange two protective diodes between two adjacent solar cells, of which one protective diode with its rear contact (third metallic contact) and the other protective diode with its front contact (first and second metallic contacts) are arranged in the front area of the solar cells, the adjacent solar cells are interconnected in series, and the protective diodes are connected by way of contacts that run within the area of the rear side of the solar cells. Therein, two connectors can go out from contacts of the protective diodes running within the area of the rear sides of the solar cells, which are connected outside of the solar cell string.

A diode is proposed according to the invention, which has a substrate of semiconducting material having a first conductivity; a layer having a second conductivity configured in a surface area of the substrate or affixed on the surface area; a first metallic contact configured on the layer having the second conductivity; and a second metallic contact, which is in direct contact with the substrate of the protective diode, arranged beside the first metallic contact and at a distance therefrom, and electrically connected by way of a p-n junction, for use as a protective diode in a solar cell assembly.

The p-n junction in the protective diode can be replaced in this way by means of a Schottky contact.

Further details, advantages and features of the invention are obtained not only from the claims and the features that can be inferred from these (alone and/or in combination), but also from the preferred embodiments that can be inferred from the following description of the drawings.

In them.

The configuration of discrete protective diodes for solar cells and their integration in a solar cell string or panel will be described in more detail in the following based on the exemplary embodiments shown in the figures. The same elements are provided herein with the same reference symbols or corresponding reference symbols.

Figure 1:
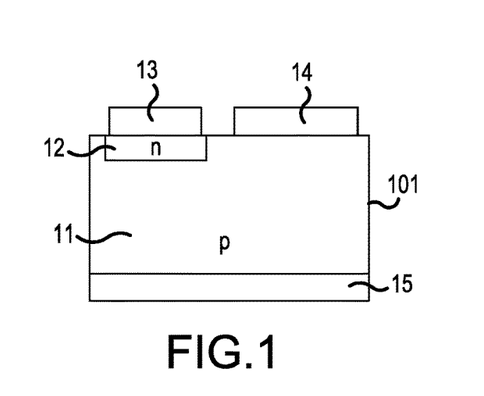
FIG. 1 shows a first embodiment of a protective diode.

In FIG. 1 a protective diode 101 according to the invention in a first embodiment is shown, which is made of a semiconducting material, such as silicon, germanium, or a material from the III and V group of the periodic system, such as GaS or GaP or GaInAs or GaInP. The main element, that is, the substrate 11, can be p-conductively doped. In a surface area and in particular in the area of the front side of the protective diode 101 up to the surface an n-doped area 12 is configured, which forms with the substrate 11 a rearwardly well locking n-p junction (n-up diode), that is, the actual protective diode.

As clarified in the depiction of FIG. 1, the n-doped area extends only over part of the upper side of the substrate 11. The n-doped area is covered on the outside by a metallic contact 13. The latter is identified as the first contact. An electrically conducting contact 15 having the conductivity of the substrate 11 extends along the rear side and is in ohmic contact therewith. This contact is identified as the third contact. A further metallic contact 14, which is located at a distance from the first contact 13 and is electrically isolated therefrom, is affixed on the surface of the substrate 11, that is, outside of the n-doped area 12; this contact is in ohmic contact with the substrate 11 and is identified as the second contact. Solar cells are connected in the manner described below by way of the electrically conducting first and second contacts 13, 14 on the front side of the protective diode 101 and the rear contact 15 (third contact).

Figure 2:
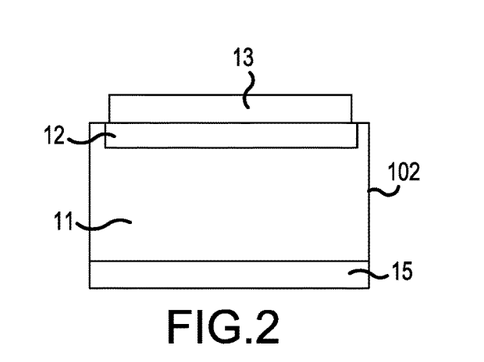
FIG. 2 shows another protective diode.

A further protective diode 102 can be seen in FIG. 2. Therein, the n-doped surface area 12 extends for the most part along the entire upper side. The n-doped area 12 is covered thereafter by the first metallic contact 13. The protective diode 102 corresponds otherwise to the protective diode 101 with regard to its configuration.

Isolation layers and/or passivation layers and/or metallizations can be affixed in practice on the semiconductor or the semiconducting layers 11, 12 or also over parts of the metallic contacts 13, 14, 15 in order to improve the properties of the protective diodes 101, 102.

The dimensioning of the protective diodes 101, 102 is suitably selected in such a way that these diodes are arranged within a string in areas that are not covered by solar cells, which are preferably configured as cropped corner cells, that is, solar cells with cropped or cut corners. The protective diodes 101, 102 should be arranged in the distant corners of the solar cells, in particular in the area of the mutually adjacent solar cells, in order to interconnect the solar cells in the manner described below.

Protective diodes with exchanged doping for correspondingly doped solar cells can also be utilized as n-up diodes, instead of the protective diodes 101, 102 with n-p junction. In this case, the doping is exchanged, that is, p→n and n→p.

Figure 3:
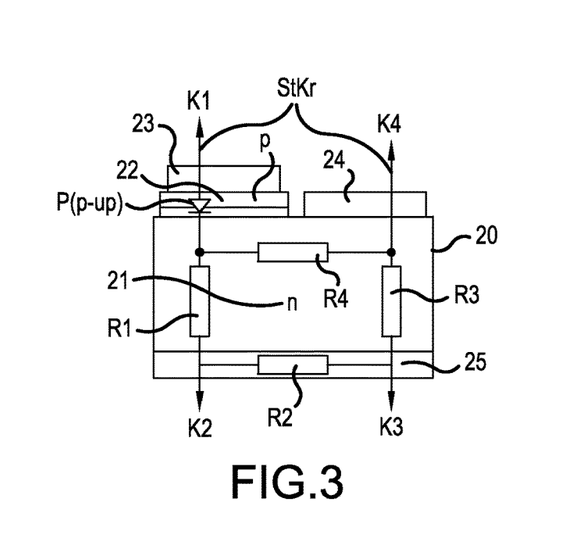
FIG. 3 shows an embodiment of a protective diode with a circuit as an alternative to FIG. 1.

In FIG. 3 a further embodiment of a protective diode 20 according to the invention is represented, which corresponds in principle to the protective diode 101. With regard to the extension of the protective diode 20, the p-n junction can first be produced over one entire side of the surface. As an example, the diffusion or ion implantation of a corresponding doping material or epitactic deposition of layers and subsequent removal (etching) of part of the area 22 oppositely doped with regard to the substrate 21 can be mentioned. The protective diode 20 depicted in FIG. 3 is of the p-up type, while a metallic contact 23 is affixed as the first contact on the p-conducting layer 22. The second metallic contact 24 is arranged at a distance and electrically isolated from this layer and is in ohmic contact with the n-conducting substrate 21. The third metallic contact 25 or rear contact extends along the rear side of the substrate 21.

That the protective diodes of the kind described above, that is, the protective diodes 101, 102 and 20, especially those shown in FIG. 1 and FIG. 3, can be used advantageously in different applications, will be clarified based on the protective diode 20. In them are shown, for this purpose, the electric circuit diagram (StKr), including the possible connection points K1, K2, K3, K4, and the elements that are electrically active in the interior, that is, the diode (P(p-up)), the resistances R1 and R3, which run between the connections K1 and K2 or K4 and K3, respectively, as well as the resistance R4, which runs horizontally through the n-conducting substrate 21 in the exemplary embodiment, and the resistance R2, which dominates in the rear contact 25 (third contact).

A rough estimate of the maximum additional voltage loss $\Delta V$ that occurs in the diode 20 as a consequence of the voltage loss at the inner resistances R1 to R4 in an accepted current of I=1 A, in addition to the voltage drop at the p-n junction, is calculated from $\Delta V = R \cdot I$ with $R=[(R1+R2+R3)\cdot R4]/[R1+R2+R3+R4]$. The estimate is carried out in such a way that the calculated resistances are always greater than they would actually be in reality, and the voltage loss turns out to be lower in reality.

A diode that corresponds to the diode 101 and is produced from 20 mΩcm of Si substrate ($p1=2E-2$ Ωcm) serves as a calculation example. The shape corresponds to that of FIG. 6, the surface of the diode 101 amounts to $F1=1$ cm$^2$, the p- (14) and n- (13) areas amount respectively to $Fn=Fp=0.5$ cm$^2$, while the double surface of the underside of the diode is not taken into consideration. The thickness of the diode 101 is $D1=150$ μm=0.015 cm, the length of the separation edge B1 between the contacts 13 and 14 amounts to $B1=1.2$ cm, their distance S1 amounts to $S1=100$ μm (0.01 cm), the thickness D2 of the metallization ($p2=1.6E-6$ Ωcm) from Ag: $D2=10$ μm (0.01 cm), and the distance A1 between the connectors 40a and 40b amounts to $A1=0.5$ cm.

The estimate is carried out with the aid of the formula for the calculation of resistances from the specific resistance ρ and the external geometry of the resistance, that is, the length L and the cross section F: $R = \rho \cdot \text{length } L/\text{cross section } F$.

For R1 and R3 (vertical resistance in the substrate 21) the following estimate applies:

$\rho 1 = 2E-2$ Ωcm of silicon for both R1 and R2 applies: surface $F = Fp(14) = Fn(13) = 0.5$ cm$^2$, Length $L = D1 = 0.015$ cm $R1 = R3 = 1.5E-4$Ω

For R2 in the contact metal of Ag; thickness $D2 = 10$ μm (0.001 cm), $\rho = 1.6E-6$ Ωcm F is calculated from $F = D2 \cdot B1 = 0.0006$ cm·1.2 cm = $7.2E-4$ cm$^2$, Length $L = A1 = 0.5$ cm $R2 = 6.6E-40$ For R4 (horizontal resistance in the substrate): $\rho 1 = 2E-2$ Ωcm of silicon F is determined as F from the thickness D1 and B1 to $F = D1 \cdot B1 = 1.2$ cm Length $L = A1 = 0.01$ cm $R4 = 1.1E-2$Ω

The voltage loss $\Delta V = R \cdot I$:

$$\Delta V = [(R1+R2+R3)*R4]/[R1+R2+R3+R4]*I$$

$$\Delta V = 0.88E-3 V = 0.88 \text{ mV}.$$

This voltage drop can be realized even lower in practice.

Since the voltage drop at the p-n junction amounts to about 0.68 V (680 mV) when a silicon diode is used, the voltage drop at the inner resistances of the protective diode will therefore make only a very minor contribution.

The use of the protective diodes according to the invention will be explained in more detail based on the following explanations, taking into consideration the standard connection techniques for solar cells.

Figure 4:
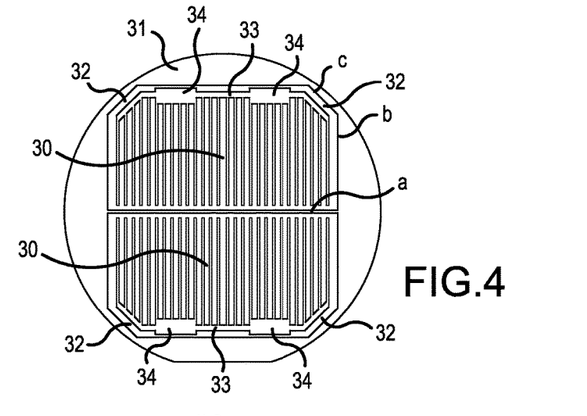
FIG. 4 shows a schematic diagram of two solar cells with cropped corners produced from a semiconducting wafer.

The currently favored design of a solar cell 30 with cropped corners 32 made of III-V material on the basis of an epitaxy wafer 31 with a 100 mm diameter is schematically shown in FIG. 4, and namely from the side of the light incidence. In a string, the metallic accumulator beam 33 with the contact surfaces 34 for mounting the electric series connections (connectors) between the cells 30 are on the shorter side of the two longitudinal sides delimited by the two cropped corners 32, which are directly adjacent to the cells that are series connected in a string. In a vastly optimal utilization of the wafer surface, the edge lengths a, b, c of the cell 30 amount to, for example, a=8 cm, b=4 cm, and c=1.35 cm.

Consequently, on the string plane in this case a triangular surface with an angle of 45□ between the edges of the borders b and c remains, wherein the edges have the lengths Ld=approx. 0.95 cm/0.95 cm/1.35 cm, that is, a surface of Fd=approx. 0.9 cm$^2$, which is not only used for the conversion of light.

Figure 5:
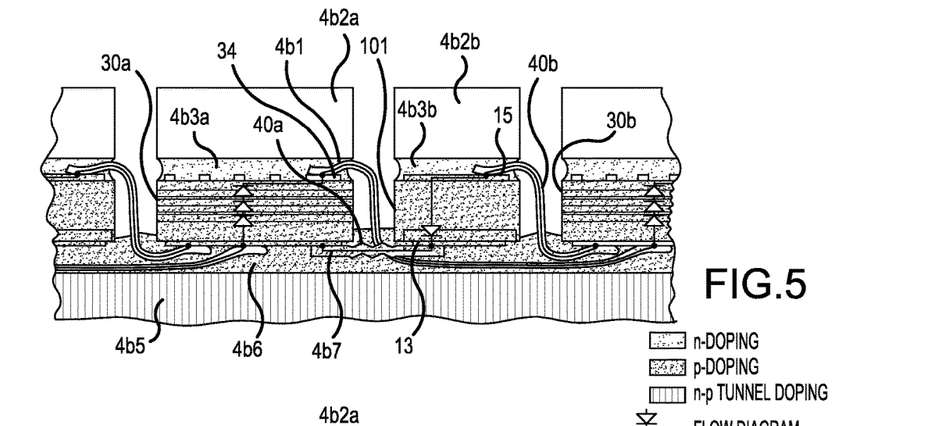
FIG. 5 shows a cross section and a section of a solar cell string.

A possible type of connection of cell to cell and cell to diode is depicted purely schematically in cross section and in section in FIG. 5, wherein the latter corresponds to the type of FIG. 2. The current propagation diagram, which is identified with reference characters 4b7, is also represented for further clarification.

The solar cells 30a, 30b are of the triple type, wherein, for example, a Ge bottom cell, a GaInAs central cell provided thereon, and finally a GaInP top cell, which are separated by means of tunnel diodes, are affixed on a germanium substrate. Reference is made with regard to this to the sufficiently known solar cell types. The solar cells themselves are mounted by means of an adhesive 4b6 on a substrate 4b5. On the side of the light incidence, the solar cells 30a, 30b, and therefore also the protective diodes 102, are covered by means of a cover glass 4b2a, 4b2b by way of an adhesive 4b3a, 4b3b.

In the exemplary embodiment, the uppermost semiconducting layer of the cells 30a, 30b is n-conducting (n-up cells), without the occurrence of a limitation of the teaching according to the invention.

In a customary production process for strings for panels, which execute the function of the carrier 4b5, the connectors 4b1 are first mounted on the light incidence side (front side) of the solar cells 30a, 30b on the front contact surfaces 34. The cover glass 4b2a is then affixed by means of the adhesive 4b3a. In this condition, the solar cells are also called CIC (connector integrated cell) or SCA (solar cell assembly). The solar cells are then rotated for connection in a string, so that the rear side is on top. The connectors 4b1 are then electrically connected, for example, by means of welding or soldering, to the rear side of the adjacent cell, which is the adjacent cell 30b in the exemplary embodiment.

At this time, the introduction of a diode 102 according to the invention, that is, in the exemplary embodiment of an n-up diode for an n-up solar cell 30a, is easier in one of the cropped corners of the cell 30a (or a corresponding diode 102 according to the invention in each of the cropped corners) of the same type, but mirror-symmetric in design. In this way, a second connector 40a is affixed on the p-conducting side, that is, in the shown case of the n-up diode on the metallic contact 15, the p-contact of a connector 40b corresponding to the connector 4b1, and the metallic contact 13 that covers the n-conducting area 12, the diode 102 is placed in one of the cropped corners, in order to then produce electrically conducting connections, on the one hand, between the rear side of the cell 30b and the metallic contact 15 of the protective diode 102 and, on the other hand, by way of the connector 40a between the contact 13 and the rear contact of the solar cell 30a (refer to circuit 4b7). When utilizing a p-up diode, the contacts 13 and 15 should be exchanged. The diode 102 can likewise be suitably provided with an adhesive 4b3b with a cover glass 4b2b or the cover glass 4b2a of the cell 30a is designed to be large enough that the diode 102 is directly glued and can be electrically connected in the previously described manner.

The further sequence of the panel production by affixing the string by means of the adhesive 4b6 on the substrate 4b5 is perceptively not affected by the installation of the protective diode 102.

A diode 102 with corresponding opposite doping can be used in the same way, for example, for a p-up cell with essentially the same design as that of FIG. 5.

Figure 6:
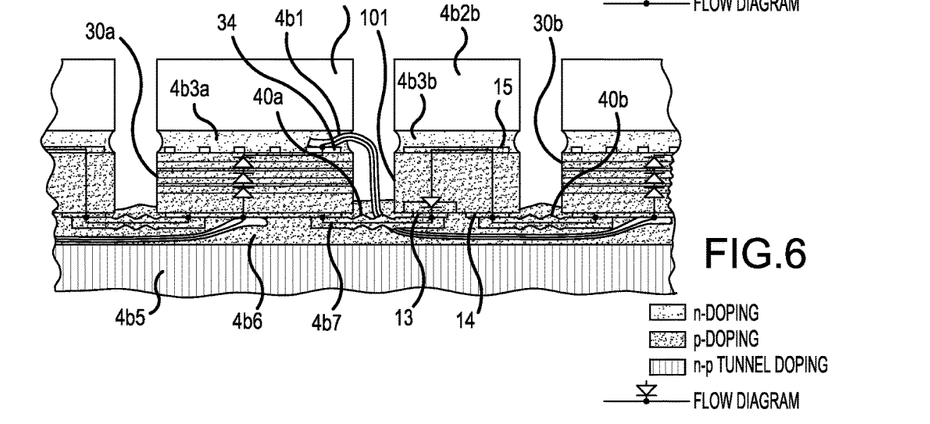
FIG. 6 shows a cross section through a panel with solar cells connected by way of protective diodes.

The use of the diode 101 (FIG. 1) is configured even simpler, since a fixation of connectors on the diode 101 before being placed in the string assembly is not required, as can be seen in FIG. 6.

In FIG. 6, a cross section through a possible connection type for the cell 30a to the cell 30b and for the cells 30a, 30b to the protective diode 101 is shown purely schematically. The current propagation diagram 4b7 is also represented herein for further clarification. Instead of the diode 101 according to FIG. 1 a diode 20 according to FIG. 3 can also be installed without abandoning the scope of the invention. The same applies to a further exemplary embodiment.

The solar cells 30a, 30b are those that were described in connection with FIG. 5, so that reference is made to the explanations related thereto. As a consequence, they are solar cells 30a, 30b of the type n-up, without producing as a consequence a limitation of the scope of the invention. In the standard production process of strings for panels, the connectors 4b1 are first applied on the front contacts 34 on the side of the light incidence of the solar cells 30a, 30b; the cover glass 4b2a is then applied with the aid of the adhesive 4b3, and the corresponding solar cells 30a, 30b, called CICs, are rotated for connection in a string, so that the rear side is on top, in order to then electrically connect the connectors 4b1 by means of, for example, welding or soldering, to the respectively adjacent cell, that is, the cell 30b in the exemplary embodiment.

The protective diode 101, which according to the n-up cell is antiparallel connected and is an n-up diode, is introduced, at the same time, as explained above. The affixation of the protective diode 101 is carried out herein in one of the cropped corners of the cell 30a. If required, a corresponding protective diode 101 can be introduced in each cropped corner, wherein the design is mirror-symmetric. The affixation is therein even simpler in comparison with the configuration of FIG. 5, since after placing the diode 101 in the assembly of the cells 30a, 30b lying side by side, solely the connectors 40a and 40b between the metallic layer extending along the n-doped layer 12 or the first metallic contact 13 must be connected to the rear side of the solar cell 30a and the electrically conducting second contact 14 running directly on the p-conducting substrate 11 in the same way as between the cells. The diode 101 can here also be suitably provided with a cover glass 4b2b by way of an adhesive 4b3b, or the cover glass of the cell 4b2a is designed sufficiently large for directly gluing in the diode 101 and electrically connecting it in this way.

The further process sequence of the panel production, such as the affixation of the string by means of a further adhesive 4b6 on the substrate 4b5, is not affected by the installation of the diode 101.

Figure 15:
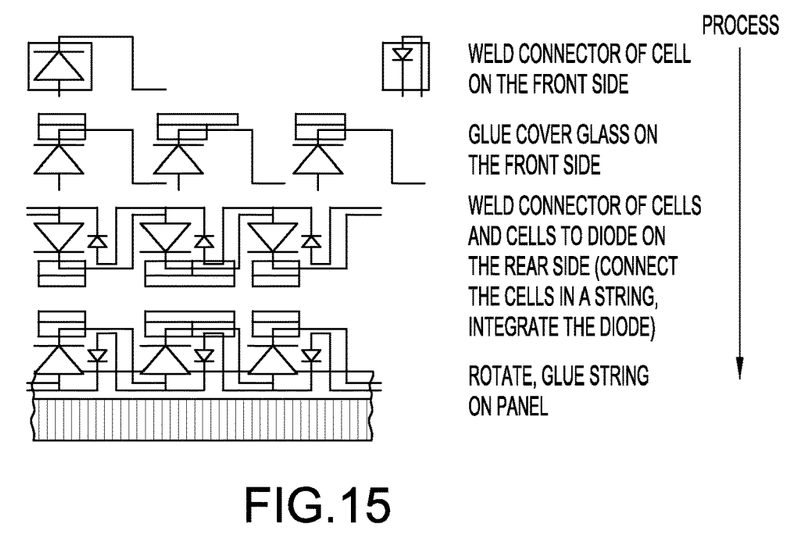
FIG. 15 shows a schematic diagram of a first process for interconnecting solar cells.

The previously explained process with the essential process steps is shown once more purely schematically in FIG. 15.

For a p-up cell with in principle the same design as that of FIG. 6, a diode according to that of FIG. 1 is used, with the limitation that the substrate is n-conducting and the doped surface layer is p-conducting.

It is also possible to interconnect the protective diode 101 between the first solar cell 30a and the second solar cell 30b in such a way that the first contact 13 is connected to the rear contact of the second solar cell 30b, and the second contact 14 is connected to the rear side of the first solar cell 30a. The p-n junction must be correspondingly redoped in a corresponding interconnection.

Figure 7:
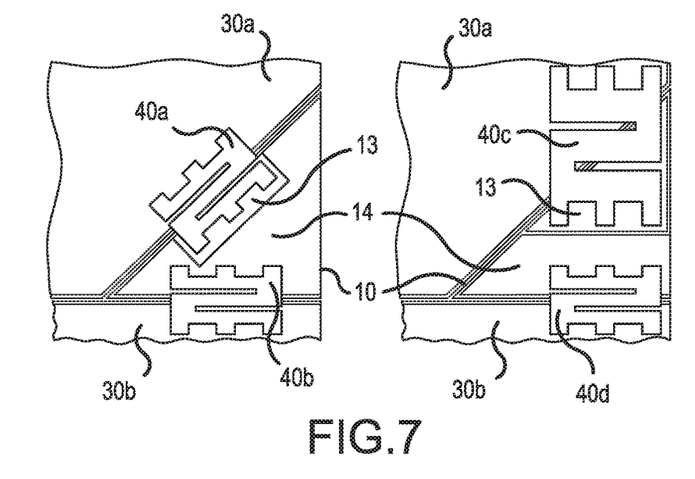
FIG. 7 shows a rear view of a section of a string with protective diodes having different geometries.

Two partial views of a string of cells 30a, 30b with protective diodes 101 seen from the back, which are interconnected in a string, are shown in section in FIG. 7. Therein, the cell string differs to that effect in that the design of the connections between the protective diode 101 and the solar cells 30a or solar cells 30b is different.

Figure 8:
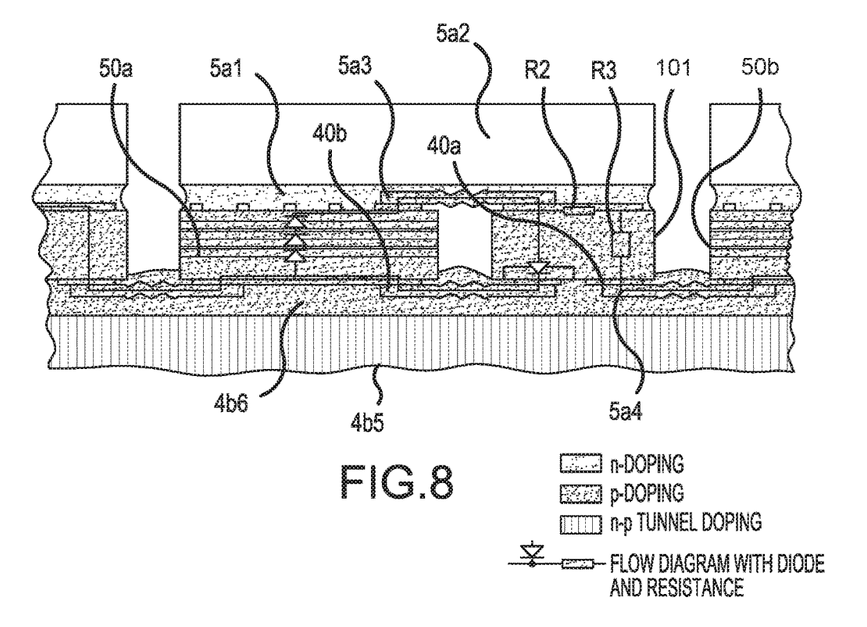
FIG. 8 shows a further embodiment of a panel in section with solar cells connected by way of protective diodes.
Figure 9:
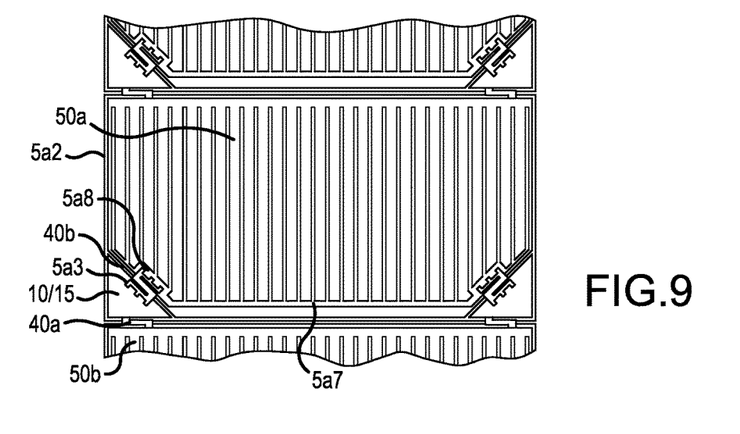
FIG. 9 shows a section in the side of the light incidence of a string interconnected by way of protective diodes.
Figure 10:
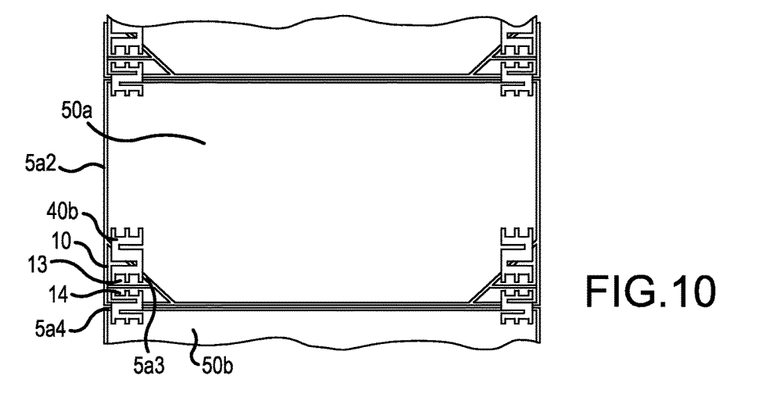
FIG. 10 shows the representation of FIG. 9, but from the rear side.

In FIG. 8 a preferred further embodiment and utilization of the protective diode according to the invention can be seen, which is not only antiparallel connected to a solar cell, but at the same time serves as a part of the connection between mutually adjacent cells. The simplified panel production can be seen in FIGS. 8 to 10 and 16, wherein the solar cells 50a, 50b are likewise of the n-up cell type, without limiting the generality. Two protective diodes 101 or 20 (having advantageously a mirror-symmetric design) are advantageously utilized herein for connecting mutually consecutive solar cells 50a, 50b, as can be directly induced from FIGS. 9 and 10. One protective diode 101 is respectively electrically connected in such a way to the underside of the diode 101, that is, the third contact 15 or 25 according to FIGS. 1, 3, that the front side of the solar cells 50a, 50b, which are interconnected in a string, runs along by means of a connector 5a3 within a cropped corner of the solar cell 50a before the mutual cover glass 5a2 is applied is by means of an adhesive 5a1. For this purpose, contact surfaces 5a are configured in the border region of the cropped corners, which are connected to the accumulator beam 5a7 in the design of the cell 50a. The solar cell 50a with the protective diodes 101 or 20 is then connected by affixing a connector 40a between the second metallic contact 14 or 24, which is in direct contact with the substrate 11 of the protective diode 101 or 20 and the rear side of the cell 50b, and by affixing a connector 40b between the first electrically conducting contact 13 or 23, which is arranged on the p-doped layer 12, and the rear side of the solar cell 50a, and is integrated into the string. The further affixation on the panel corresponds to the explanations that were provided previously.

The flow diagram 5a4 with the relevant diodes and resistances is depicted in FIG. 8. The connector 40b can also be mounted (as can be seen in the process sequence of FIG. 16) before affixing the mutual cover glass 5a2 between the rear side of the cell 50a and the contact 13 of the diode 101.

Figure 16:
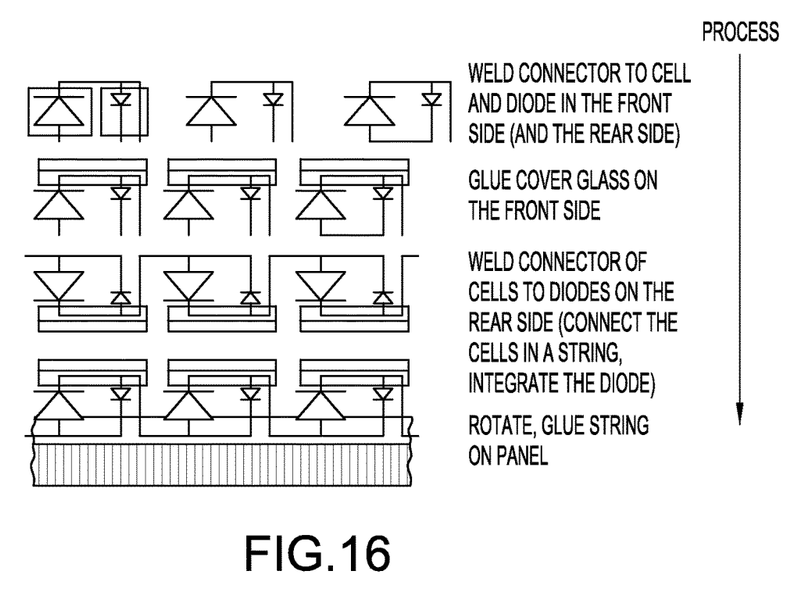
FIG. 16 shows a schematic diagram of a second process for interconnecting solar cells.

The process sequence for interconnecting the protective diode 101 (and accordingly the protective diode 20) with the solar cells 50a, 50b or antiparallel with respect to the solar cell 50a is shown purely schematically in FIG. 16. Therein, the protective diodes 101 are first arranged in the "free" corners of the solar cells 50a, 50b and the front contacts of the first solar cells 50a and the second solar cells 50b are respectively connected to the third contacts of protective diodes 101, which are customarily called rear contacts. A special protective diode 101 is allocated therein to each first and second solar cell 50a, 50b. A first connector 5a3 is used for this purpose. The connector 40b can also be affixed at this time. A cover glass 5a2 is then glued on respectively one solar cell with the protective diode interconnected therewith, the units produced in this way are rotated, and the first and second contacts 13, 14 of the protective diodes 101 are then connected to first and second solar cells (if it has not already happened in part), such as by welding, in order to connect the solar cells in a string with a simultaneous integration of the protective diodes. After the string produced in this way is rotated, it is glued on a panel in the usual manner.

An estimate of the additional voltage drop between the cells 50a and 50b, which is produced through the application of the protective diode in the exemplary manner for this example, can be seen again in FIG. 3. Herein, the current flows from the connection point K2 toward K4. The current will flow through serial resistances R2+R3 (the resistances R3+R4 are parallel and reduce at the most the total resistance); the voltage drop at I=1 A current flow is therefore at the most $$\Delta V = (R2+R3) \cdot I = 6.6E-4 + 1.5E-4) \cdot 1A = 8.1E-4 V = 0.81 \text{ mV}$$

and will be lower in practice.

The tendency toward large solar cells makes the introduction of solar cells with main axes of about 8 cm 8 cm ever more probable. One cell is produced therein for each 4" (4 inch) wafer, so that the reduction of the final expense is of particular importance in the application of easy to integrate discrete protective diodes.

Figure 11:
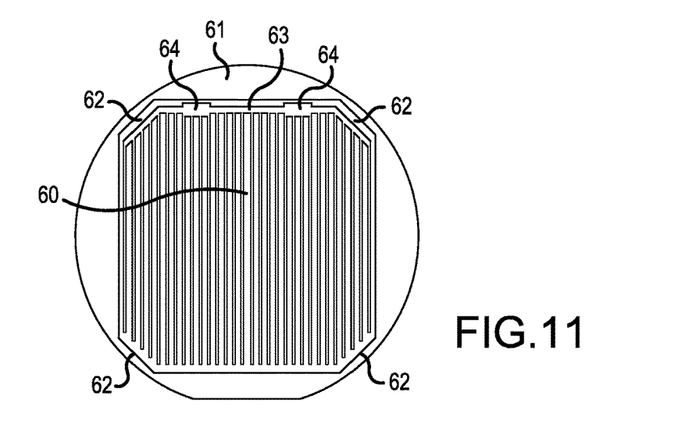
FIG. 11 shows a schematic diagram of a solar cell with cropped corners.

FIG. 11 shows a possible design of such a solar cell 60 with a total of 4 cropped corners 62. Corresponding solar cells 60 can be interconnected with the adjacent cells according to the previously occurred explanations with one or two protective diodes with a corresponding design.

Figure 12:
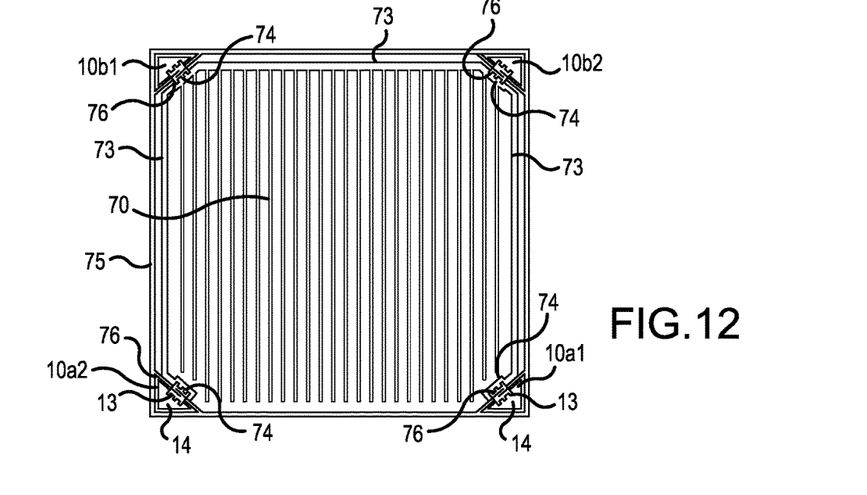
FIG. 12 shows a solar cell with cropped corners and protective diodes arranged in them.
Figure 13:
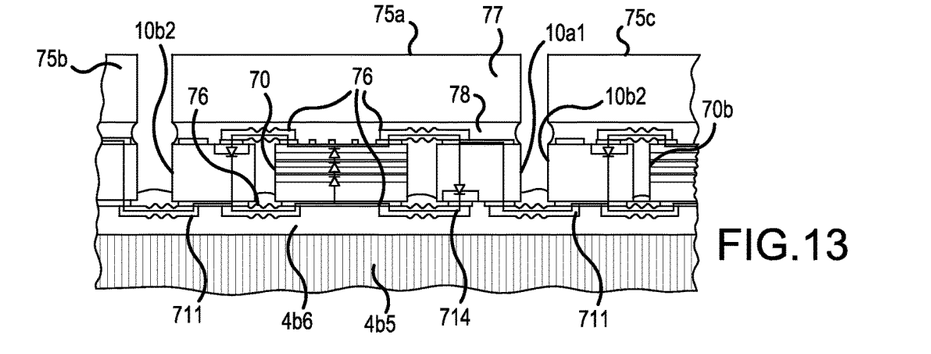
FIG. 13 shows a cross section through a panel with solar cells respectively interconnected by way of two protective diodes.

Through a special design of a solar cell 70 according to FIG. 12, in which the accumulator beam 73 is electrically conductively connected to all four contact surfaces 7, which are displaced into the area of the borders or edges of the cropped corners 76, four diodes 10a1, 10a2, 10b1, 10b2 can protect the cell 70 and the connection to the previous cell 70a, subsequently the cell 70b, can be carried out only along the rear side according to the explanations in connection with FIG. 8. Herein an internal connection of the cells to the protective diodes according to the invention and of external connections among themselves to the protective diodes according to the invention is carried out. FIG. 13 shows in this way a purely schematic cross section through a panel with cells 70, which each have four cropped corners. The connection of the cells among themselves is carried out by way of so-called external connectors 711 on the rear side of the SCA 75 (SCA=solar cell assembly=solar cell 70 and connected diodes 10a1, 10a2, 10b1, 10b2 provided on the front side (side of light incidence) by means of the adhesive 78 with a mutual cover glass 77), by means of the protective diodes 10a1, 10a2, 10b1, 10b2, which are connected to the cell by means of so-called internal connectors 76 (within the SCAs).

As diodes 10b1 and 10b2 the diodes corresponding to FIG. 2, as well as the protective diodes corresponding to FIGS. 1 and 3 having an inverted conductivity can be utilized, since the second contact 14 of the diode corresponding to FIG. 1 is not required to affix a connector, and the surface of the first contact 13 can take up the entire surface of the front side in order to reduce the electric resistance in the diode.

Figure 14:
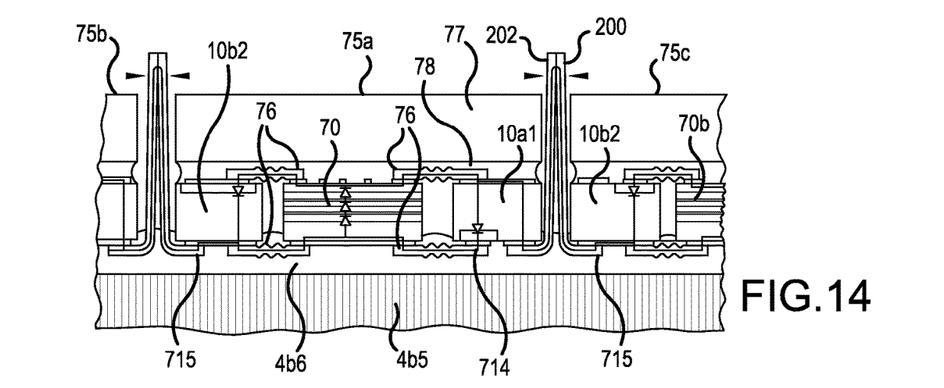
FIG. 14 shows an embodiment of the solar cell connections by way of protective diodes according to FIG. 13.

A variation of the external connection is schematically represented in FIG. 14. Since there is no danger of a short circuit on the sides of the diodes 10a1 and those running adjacent thereto, which are of the type of those of FIGS. 1 and 2 and have an inverted conductivity, one half of the external connector can be guided over the side of the cover glass 77 on the front side of the CIC, in order to carry out an electric connection by means of, for example, welding or soldering (see arrow). The advantage of this type of technology is that the SCA can be measured up to shortly before the final production of the panel, and in the case of a malfunction, a repair procedure, for example the exchange of an SCA, can be carried out relatively easily. A corresponding connector also offers the possibility of connecting the front side of the cover glass 77 to the cell against electrostatic charge.

Especially in FIGS. 7, 9, 10 and 12 it can be seen that the protective diodes 20, 101 have a triangular geometry in plan view, preferably a geometry with a right angle and in particular simultaneously long legs. Other geometries are likewise possible. Independently from this, the protective diodes fill the free spaces formed between the solar cells by means of the cropped corners.

The invention claimed is:

1. A solar cell assembly, comprising:
a plurality of solar cells arranged in a string, at least first and second of said solar cells having a rectangular shape with cropped corners in plan view, and with the at least first and second of said solar cells having photoactive semiconducting layers running between a front contact and a rear contact of the solar cells,
at least one discrete protective diode arranged in an area of the cropped corners between said first and second solar cells and interconnecting said first and second solar cells,
said at least one protective diode comprising:
a substrate formed of a semiconducting material having a first conductivity, the substrate having a first side and a second side opposite from the first side, the substrate including a layer section formed in a first portion of the first side of the substrate, the layer section having a second conductivity that is different from the first conductivity,
a first metallic contact arranged on the layer section having the second conductivity formed in the first portion of the first side of the substrate,
a second metallic contact arranged on a second portion of the first side of the substrate beside the first metallic contact and at a distance therefrom,
connectors extending from the first and second metallic contacts for interconnecting the protective diode, and
a third metallic contact arranged on the second side of the substrate and opposite to the first and second metallic contacts, wherein said third metallic contact is connected to the first solar cell, or to the second solar cell via the substrate of the protective diode,
wherein the second metallic contact is in direct contact with the substrate of the protective diode and is electrically connected to the first metallic contact by way of a p-n junction,
wherein, in a cross-sectional view of the at least one protective diode, the third metallic contact arranged on the second side of the substrate fully overlaps with both of the first and the second metallic contacts arranged on the first side of the substrate in a direction perpendicular a plane that is parallel to a surface of the substrate, and
wherein the first metallic contact is electrically connected to the rear contact of the first solar cell directly by a first one of the connectors,
wherein the second metallic contact is electrically connected to the rear contact of the second solar cell directly by a second one of the connectors, and
wherein the third metallic contact is directly connected to the front contact of the first solar cell directly by a third connector.

2. The solar cell assembly of claim 1, wherein the connectors that extend from the first and second metallic contacts connect the first solar cell to the second solar cell.

3. The solar cell assembly of claim 1, wherein the protective diode is antiparallel interconnected between the solar cells by way of the second metallic contact.

4. The solar cell assembly of claim 1, wherein the protective diode is antiparallel interconnected between the solar cells by way of the first metallic contact.

5. The solar cell assembly of claim 1, wherein the first and second solar cells are connected by way of at least two of said protective diodes, and the third metallic contact of a first of said two protective diodes is connected to the rear contact of the second solar cell, as well as to the second metallic contact of a second of said two protective diodes, having a third metallic contact connected to the front contact of the first solar cell.

6. The solar cell assembly of claim 5, wherein a connector extends from the third metallic contact of the first protective diode, with the connector extending from the second metallic contact of the second protective diode projecting over the front side of the first and second solar cells or cover glasses thereof.

7. The solar cell assembly of claim 6, wherein the connector extending from the third metallic contact is connected to the contact by welding or soldering.

8. The solar cell assembly of claim 1, wherein said at least one protective diode has a triangular geometry in plan view.

9. The solar cell assembly of claim 1, wherein said at least one protective diode has the geometry of a triangular column.

10. The solar cell assembly of claim 1, wherein the protective diode has a base surface F of about $0.7\ \text{cm}^2 \leq F \leq 1\ \text{cm}^2$.

11. The solar cell assembly of claim 10, wherein the protective diode has a base surface F of about $0.8\ \text{cm}^2 \leq F \leq 0.9\ \text{cm}^2$.

12. The solar cell assembly of claim 1, wherein in each cropped corner of at least one of the first and second solar cells, one said protective diode is arranged.

13. The solar cell assembly of claim 1, wherein the first conductivity is n-conducting and the second conductivity is p-conducting, or the first conductivity is p-conducting and the second conductivity is n-conducting.

14. The solar cell assembly of claim 1 or 2, wherein the first solar cell and/or the second solar cell is a triple cell.

15. The solar cell assembly of claim 13, wherein the triple cell comprises one Ge bottom cell, one GaInAs center cell, and one GaInP top cell.

16. The solar cell assembly of claim 5, wherein:
the first and second solar cells are arranged side by side, and are connected by way of two said protective diodes,
the two said solar cells are n-conducting in the front contact,
one of the two said protective diodes having a front contact within the layer conductivity which is n-conducting and having the section having the second conductivity which is n-conducting, and the other of said protective diodes having on the rear contact within the layer section having the second third metallic contact.

17. The solar cell assembly of claim 5, wherein the third metallic contact of the first protective diode is connected to a rear surface area of the second solar cell as well as to the second metallic contact of the second protective diode, the third metallic contact of the second protective diode, which runs on a front side of the first and second solar cells forming the string, is connected to the front contact of the first solar cell, and the first metallic contact of the second protective diode, which runs on a rear side of the string, is connected to the rear contact of the first solar cell.

18. The solar cell assembly of claim 17, wherein in solar cells with a p-n junction, the first protective diode has an n-p junction, and the second protective diode has a p-n junction.

19. A solar cell assembly, comprising:
a first solar cell and a second solar cell, the first and second solar cells having a rectangular shape with cropped corners in plan view and photoactive semiconducting layers running between a front contact and a rear contact of the solar cells; and
a first discrete protective diode arranged in an area of the cropped corners between said first and second solar cells and interconnecting said first and second solar cells, the first protective diode comprising:
a substrate formed of a semiconducting material having a first conductivity;
a first metallic contact arranged on a first side of the substrate; and
a second metallic contact arranged directly on a second side of the substrate;
wherein the substrate includes a doped layer section having a second conductivity formed on the first side of the substrate, and the doped layer section is arranged between, and directly contacts with, the substrate and the first metallic contact,
wherein the first metallic contact is electrically connected to the rear contact of the first solar cell directly by a first connector,
wherein the second metallic contact is electrically connected to the rear contact of the second solar cell directly by a second connector,
wherein the front contact of the first solar cell is electrically connected to the rear contact of the second solar cell directly by a third connector,
wherein the second metallic contact covers substantially the entire second side of the substrate, and
wherein a width of formation of the doped layer section is less than a width of the substrate.

20. The solar cell assembly of claim 19, wherein the second metallic contact completely covers the entire second side of the substrate.

21. The solar cell assembly of claim 19, wherein the doped layer is formed on a first portion of the first side of the substrate, wherein a second portion of the first side of the substrate is free from the doped layer, and wherein the first protective diode further includes a third metallic contact formed directly on the substrate at the second portion of the first side of the substrate.

22. The solar cell assembly of claim 21, wherein the doped layer is formed within the substrate.

23. The solar cell assembly of claim 21, wherein the third metallic contact of the first protective diode is directly connected to a rear side of the second solar cell, and wherein a front side of the first solar cell is directly connected to the rear side of the second solar cell.

24. The solar cell assembly of claim 21, wherein the second metallic contact is directly connected to a front side of the first solar cell, and wherein the third metallic contact is directly connected to a rear side of the second solar cell.

25. The solar cell assembly of claim 21, further comprising a second discrete protective diode having the same structure as the first discrete protective diode,
wherein the second metallic contact of the first protective diode is directly connected to a front side of the first solar cell,
wherein the third metallic contact of the first protective diode is directly connected to a second metallic contact of the second protective diode,
wherein the second metallic contact of the second protective diode is directly connected to a rear side of the second solar cell, and
wherein a first metallic contact of the second protective diode is directly connected to a front side of the solar cell.

26. The solar cell assembly of claim 21, further comprising a second discrete protective diode having the same structure as the first discrete protective diode,
wherein the second metallic contact of the first protective diode is directly connected to a front side of the first solar cell,
wherein the third metallic contact of the first protective diode is connected to a second metallic contact of the second protective diode via a connector,
wherein the second metallic contact of the second protective diode is directly connected to a rear side of the second solar cell,
wherein a third metallic contact of the second protective diode is directly connected to a front side of the solar cell, and wherein the connector extends from the rear side towards and beyond the front side of the first and second solar cells and has a height greater than a thickness of the substrate of the first and second protective diodes, the connector having a folded part.

* * * * *